(12) United States Patent
Chan

(10) Patent No.: US 9,653,656 B2
(45) Date of Patent: May 16, 2017

(54) LED PACKAGES AND RELATED METHODS

(75) Inventor: Hsun-Wei Chan, Taoyuan (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 566 days.

(21) Appl. No.: 13/422,213

(22) Filed: Mar. 16, 2012

(65) Prior Publication Data

US 2013/0242524 A1 Sep. 19, 2013

(51) Int. Cl.
| | |
|---|---|
| H01L 33/50 | (2010.01) |
| H05K 7/00 | (2006.01) |
| H01L 33/48 | (2010.01) |
| H01L 33/62 | (2010.01) |

(52) U.S. Cl.
CPC ............ *H01L 33/486* (2013.01); *H01L 33/50* (2013.01); *H01L 33/62* (2013.01); *H01L 2224/48091* (2013.01); *H01L 2224/48247* (2013.01); *H01L 2224/49113* (2013.01)

(58) Field of Classification Search
USPC ................... 361/813; 257/99, 100, 666, 676
See application file for complete search history.

(56) References Cited

U.S. PATENT DOCUMENTS

| | | | |
|---|---|---|---|
| 5,847,458 A | 12/1998 | Nakamura et al. | |
| 6,001,671 A | 12/1999 | Fjelstad | |
| 6,238,952 B1 | 5/2001 | Lin | |
| 6,242,284 B1 | 6/2001 | Kang et al. | |
| 6,261,864 B1 | 7/2001 | Jung et al. | |
| 6,291,271 B1 | 9/2001 | Lee et al. | |
| 6,306,685 B1 | 10/2001 | Liu et al. | |
| 6,333,252 B1 | 12/2001 | Jung et al. | |
| 6,342,730 B1 | 1/2002 | Jung et al. | |
| 6,348,726 B1 | 2/2002 | Bayan et al. | |
| 6,365,922 B1* | 4/2002 | Chang ............................. 257/98 | |
| 6,400,004 B1 | 6/2002 | Fan et al. | |
| 6,451,627 B1 | 9/2002 | Coffman | |
| 6,495,909 B2 | 12/2002 | Jung et al. | |
| 6,498,099 B1 | 12/2002 | McLellan et al. | |
| 6,528,893 B2 | 3/2003 | Jung et al. | |

(Continued)

FOREIGN PATENT DOCUMENTS

| | | |
|---|---|---|
| CN | 101246938 A | 8/2008 |
| CN | 101442035 | 5/2009 |

(Continued)

OTHER PUBLICATIONS

Feng et al.; "Packaging and AC Powering of LED Array", Electronic Components and Technology Conference (ECTC), 2010 Proceedings 60th, 512, (Jun. 2010).

(Continued)

*Primary Examiner* — Jenny L Wagner
*Assistant Examiner* — Michael E Moats, Jr.
(74) *Attorney, Agent, or Firm* — Klein, O'Neill & Singh, LLP

(57) ABSTRACT

An LED package with trenches traversing a die pad to provide a mechanical interlock mechanism to strengthen bonding between the die pad and an insulator such that de-lamination is less likely to occur between the die pad and the insulator. A chip carrying region is defined by a barrier portion formed by the insulator in the trenches and in gaps between electrodes and the die pad, such that a light converting layer is confined within the barrier portion.

20 Claims, 8 Drawing Sheets

(56) References Cited

U.S. PATENT DOCUMENTS

| | | | |
|---|---|---|---|
| 6,534,330 B2 | 3/2003 | Sakamoto et al. | |
| 6,545,347 B2 | 4/2003 | McClellan | |
| 6,586,677 B2 | 7/2003 | Glenn | |
| 6,658,734 B2 | 12/2003 | Yamada et al. | |
| 6,664,615 B1 | 12/2003 | Bayan et al. | |
| 6,700,188 B2 | 3/2004 | Lin | |
| 6,770,498 B2 | 8/2004 | Hsu | |
| 6,812,552 B2 | 11/2004 | Islam et al. | |
| 6,861,295 B2 | 3/2005 | Jung et al. | |
| 6,927,096 B2 | 8/2005 | Shimanuki | |
| 6,967,395 B1 | 11/2005 | Glenn et al. | |
| 6,993,594 B2 | 1/2006 | Schneider | |
| 6,995,459 B2 | 2/2006 | Lee et al. | |
| 6,995,510 B2 | 2/2006 | Murakami et al. | |
| 7,049,177 B1 | 5/2006 | Fan et al. | |
| 7,098,588 B2 | 8/2006 | Jäger et al. | |
| 7,125,798 B2 | 10/2006 | Sakamoto et al. | |
| 7,128,442 B2 | 10/2006 | Lee et al. | |
| 7,183,630 B1 | 2/2007 | Fogelson et al. | |
| 7,247,526 B1 | 7/2007 | Fan et al. | |
| 7,271,032 B1 | 9/2007 | McLellan et al. | |
| 7,297,293 B2 | 11/2007 | Tamaki et al. | |
| 7,372,198 B2 | 5/2008 | Negley | |
| 7,608,930 B2 | 10/2009 | Kasuya et al. | |
| 7,663,095 B2 | 2/2010 | Wong et al. | |
| 7,683,461 B2 | 3/2010 | Lau | |
| 7,695,990 B2 | 4/2010 | Sorg et al. | |
| 7,807,498 B2 | 10/2010 | Shoji et al. | |
| 8,044,420 B2 | 10/2011 | Lee et al. | |
| 8,125,062 B2 | 2/2012 | Shoji et al. | |
| 8,377,750 B2 | 2/2013 | Camacho et al. | |
| 2003/0006055 A1 | 1/2003 | Chien-Hung et al. | |
| 2004/0084681 A1 | 5/2004 | Roberts | |
| 2004/0126117 A1* | 7/2004 | Lo | G02B 6/4214 398/139 |
| 2005/0247944 A1 | 11/2005 | Haque et al. | |
| 2006/0118807 A1 | 6/2006 | Ives et al. | |
| 2007/0018291 A1 | 1/2007 | Huang et al. | |
| 2007/0052076 A1 | 3/2007 | Ramos et al. | |
| 2007/0059863 A1 | 3/2007 | Li et al. | |
| 2007/0085199 A1 | 4/2007 | Ong et al. | |
| 2007/0181983 A1 | 8/2007 | Takai et al. | |
| 2008/0012036 A1* | 1/2008 | Loh | H01L 33/483 257/99 |
| 2008/0062701 A1 | 3/2008 | Harrah et al. | |
| 2008/0067649 A1 | 3/2008 | Matsunaga et al. | |
| 2008/0121921 A1 | 5/2008 | Loh et al. | |
| 2008/0194061 A1 | 8/2008 | Medendorp | |
| 2008/0217637 A1* | 9/2008 | Kim et al. | 257/98 |
| 2008/0258278 A1 | 10/2008 | Ramos et al. | |
| 2009/0001869 A1 | 1/2009 | Tanimoto et al. | |
| 2010/0044843 A1 | 2/2010 | Chang Chien et al. | |
| 2010/0270571 A1 | 10/2010 | Seo | |
| 2011/0073896 A1 | 3/2011 | Xu | |
| 2011/0278609 A1 | 11/2011 | Jeong et al. | |
| 2011/0278610 A1 | 11/2011 | Jeong et al. | |

FOREIGN PATENT DOCUMENTS

| | | |
|---|---|---|
| CN | 101540309 | 9/2009 |
| CN | 102044510 | 5/2011 |
| CN | 201946628 U | 8/2011 |
| JP | 5166985 | 7/1993 |
| JP | 11195733 | 7/1999 |
| JP | 2001024135 | 1/2001 |
| KR | 20060023663 | 3/2006 |
| WO | WO2008081696 | 7/2008 |

OTHER PUBLICATIONS

Jordan et al.; "Optimized heat transfer and homogeneous color converting for ultra high brightness LED package," Proc. SPIE 6198, 61980B (2006).

Lai et al.; "Development and performance charaterizations of a QFN/HMT package"; Electronic Components and Technology Conference; pp. 964-967 (2008).

Search report from PRC Patent Office (SIPO) on co-pending CN application (2012102606816) dated May 5, 2015.

* cited by examiner

LED PACKAGES AND RELATED METHODS

TECHNICAL FIELD

The present invention relates to a package structure, and in particular to a light-emitting diode package structure.

BACKGROUND

Light-emitting diode (LED) devices have many diverse applications. For example, they are used as light sources for scanners, projectors, liquid crystal displays, fascias, traffic lights, etc. Compared with conventional light sources, such as incandescent lights, LED devices have numerous advantages, including compact size, long lifespan, low driving voltage/current, high structural strength, no mercury content (so less pollution when disposed of), high luminous efficiency for energy savings, etc.

LED devices typically include at least one surface-mount type LED package with an LED chip therein. LED packages including a pre-molded lead frame to carry the LED chip, instead of a conventional ceramic substrate, have been proposed. A pre-molded lead frame includes an insulating molding material encapsulating a lead frame having positive and negative electrical contacts exposed from the molding material.

Unfortunately, the bond between the lead frame and the molding material tends to be relatively weak, and the difference between the coefficients of thermal expansion (CTE) the lead frame and the molding material is very large. Because of the CTE mismatch, stresses are induced at the interface between the lead frame and the molding material as the conventional package experiences temperature cycling. The stresses, in turn, result in the delamination between the lead frame and the molding material when, for example, the LED package is surface-mounted to a printed wiring board during A solder reflow process. The LED package may subsequently be damaged by exposure to air or moisture through the delamination site.

SUMMARY

One of the present embodiments comprises a light-emitting diode (LED) package. The package comprises a housing having an opening with an open top, a closed bottom and side walls extending between the closed bottom and the open top. The housing includes a lead frame including a die pad and at least one electrode. The at least one electrode is isolated from the die pad by at least one gap. The die pad includes first and second trenches located within the opening of the housing. An end of each trench is connected to the at least one gap. The housing further includes a first insulator partially encapsulating the lead frame such that a portion of the upper surface of the die pad and a portion of the at least one electrode are exposed from the first insulator and the at least one gap and the trenches are at least partially filled by the first insulator. The package further comprises an LED chip disposed on the exposed upper surface of the die pad and located between the two trenches. The package further comprises at least one wire connecting the LED chip to the exposed part of the at least one electrode. The package further comprises a second insulator encapsulating the LED chip and the wire.

Another of the present embodiments comprises a carrier for a light-emitting diode (LED) package. The carrier comprises a lead frame. The lead frame includes a die pad having an upper surface, a lower surface, and first and second trenches extending completely across the upper surface. The lead frame further includes first and second electrodes located on opposite sides of the die pad and being isolated therefrom. The die pad and the first electrode are separated by a first gap that connects a first end of the first trench and a first end of the second trench. The die pad and the second electrode are separated by a second gap that connects a second end of the first trench and a second end of the second trench. The upper surface of the die pad comprises a chip carrying region bounded by the first gap, the second gap, the first trench, and the second trench. The carrier further comprises an insulator encapsulating a portion of the lead frame. The insulator leaves exposed at least the chip carrying region of the die pad, a portion of the first electrode, and a portion of the second electrode. The first and second gaps and the first and second trenches are at least partially filled by the insulator.

Another of the present embodiments comprises a light-emitting diode (LED) package. The package comprises a lead frame. The lead frame includes a die pad having first and second trenches traversing an upper surface thereof. The lead frame further includes first and second electrodes located on opposite sides of the die pad and spaced therefrom by first and second gaps connecting the first and second trenches. The gaps and the trenches define a chip carrying region on the die pad. The package further comprises a first insulator at least partially filling the first and second trenches and the first and second gaps and forming a barrier portion surrounding the chip carrying region. The package further comprises an LED chip located in the chip carrying region. The package further comprises a plurality of wires connecting the LED chip to the first and second electrodes. The package further comprises a second insulator encapsulating the LED chip and the wires.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION

Figure 1:
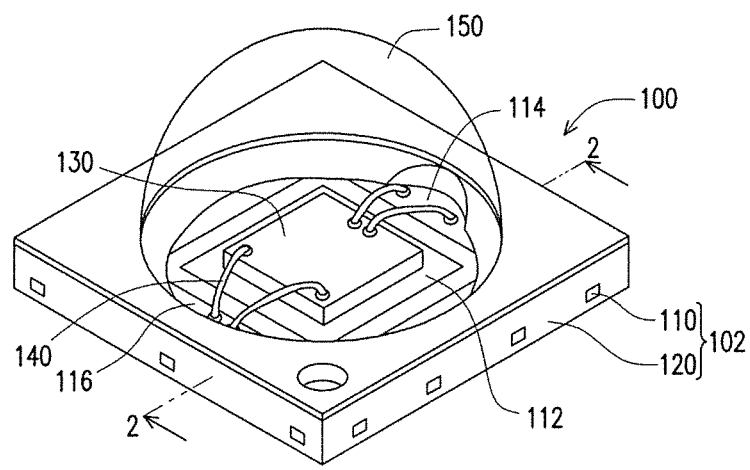
FIG. 1 is a top perspective view of one embodiment of an LED package.

Referring to FIG. 1, an LED package 100 according to one of the present embodiments is shown. The LED package 100 includes a housing 102 including a lead frame 110 encapsulated in a first insulator 120, an LED chip 130 disposed in an opening defined within the housing 102, and a second insulator, or lens, 150.

Figure 2:
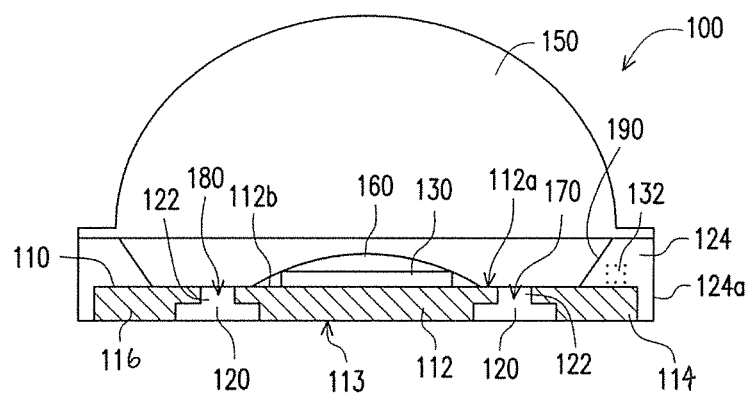
FIG. 2 is a side cross-sectional view of the LED package of FIG. 1 taken along the line 2-2 in FIG. 1.

Referring to FIG. 2, which is a side cross-sectional view of the LED package 100 if FIG. 1, the lead frame 110 includes a die pad 112, a first electrode 114, and a second electrode 116. The lead frame 110 is typically made of metal, such as copper or aluminum. The surface of the lead frame 110 may be plated with a metal coating, such as silver or gold. to enhance conductivity.

Figure 3:
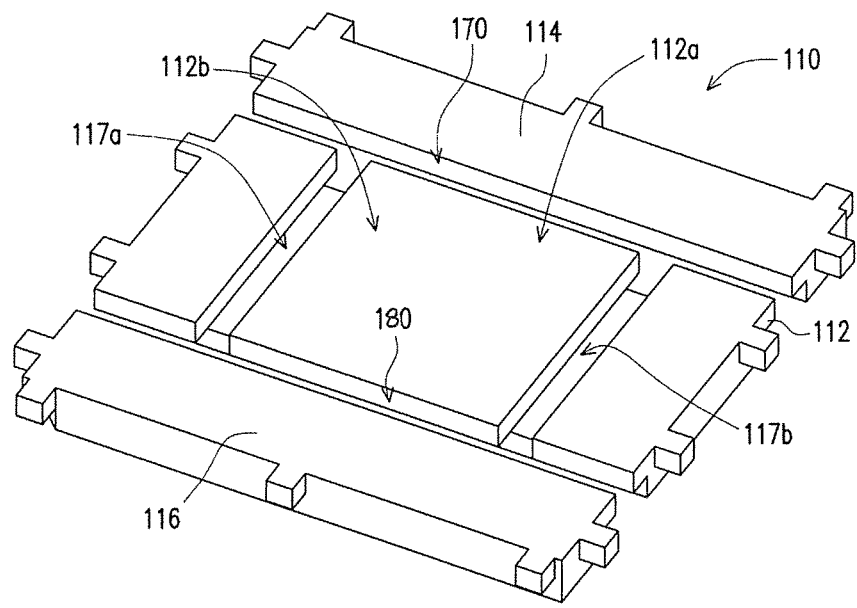
FIG. 3 is a top perspective view of a lead frame of the LED package of FIG. 1.
Figure 6:
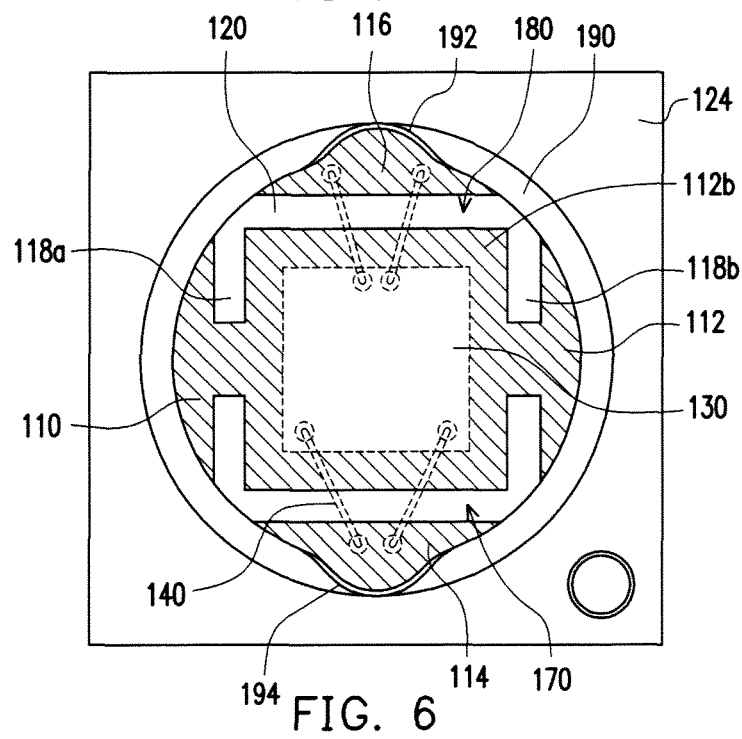
FIG. 6 is a top plan view of another embodiment of an LED package.

The first electrode 114 and the second electrode 116 are located on opposite sides of the die pad 112. The die pad 112 and the first electrode 114 are separated by a first gap 170, and the die pad 112 and the second electrode 116 are separated by a second gap 180. Referring to FIG. 3, which illustrates the lead frame 110 from an upper perspective, the die pad 112 includes two trenches 117a, 117b traversing the upper surface 112a thereof. In an alternative embodiment, the two trenches may extend only partially across the upper surface 112a, as illustrated by trenches 118a and 118b in FIG. 6, which is discussed in detail below.

Figure 4:
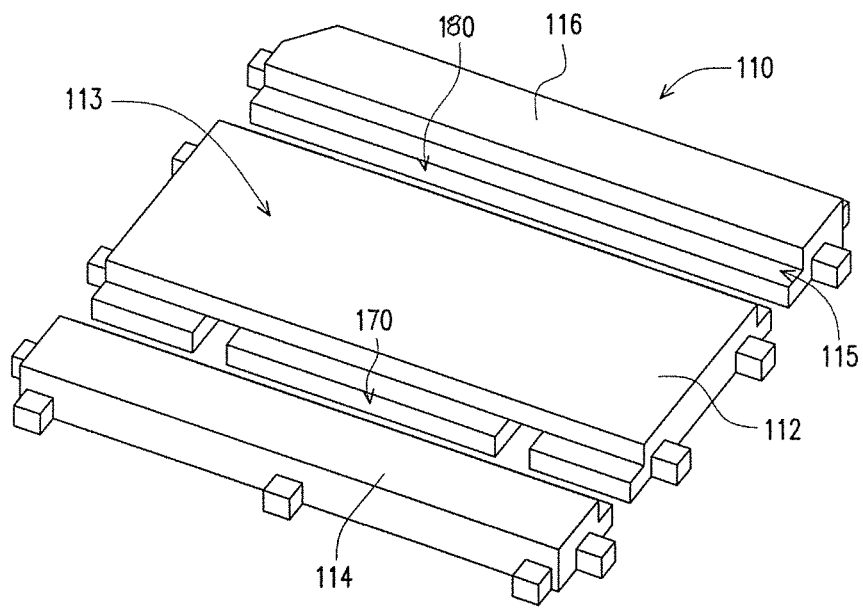
FIG. 4 is a bottom perspective view of the lead frame of FIG. 3.

Referring back to FIGS. 2 and 3, the first gap 170 separates the die pad 112 from the first electrode 114, and the second gap 180 separates the die pad 112 from the second electrode 116. Thus, on the upper surface 112a of the die pad 112, the first gap 170, the second gap 180, the first trench 117a, and the second trench 117b define boundaries of a chip carrying region 112b. The trenches 117a, 117b are filled by a part of the first insulator 120. Since the trenches 117a, 117b are located within the housing's opening, the insulator 120 filling the trenches 117a, 117b provides additional mechanical interlock to strengthen the bonding between the die pad 112 and the first insulator 120, such that delamination does not easily occur between the die pad 112 and the first insulator 120. Referring to FIG. 4, which illustrates the lead frame 110 from a lower perspective, the lead frame 110 includes at least one concave portion 115 on the first electrode 114 or the second electrode 116.

Referring to FIG. 2. and as further described below, the first insulator 120 extends around portions of the lead frame 110 to electrically isolate the die pad 112, the first electrode 114, and the second electrode 116 from one another. The first insulator 120 further forms a perimeter portion 124 that circumscribes the package 100, and is defined by a vertical outer wall 124a and a slanted inner wall 190. The slanted inner wall 190 is circular to accommodate the hemispherical second insulator 150. The perimeter portion 124 and the lead frame 110 together define a housing including an opening with an open top, a closed bottom and sides 190 connecting the closed bottom and the open top. In certain embodiments, the first insulator 120 may be a molding compound, such as, for example, a transparent polymer or a translucent polymer, a soft gel, an elastomer, a resin, an epoxy resin, a silicone, and/or an epoxy-silicone hybrid resin.

Figure 5:
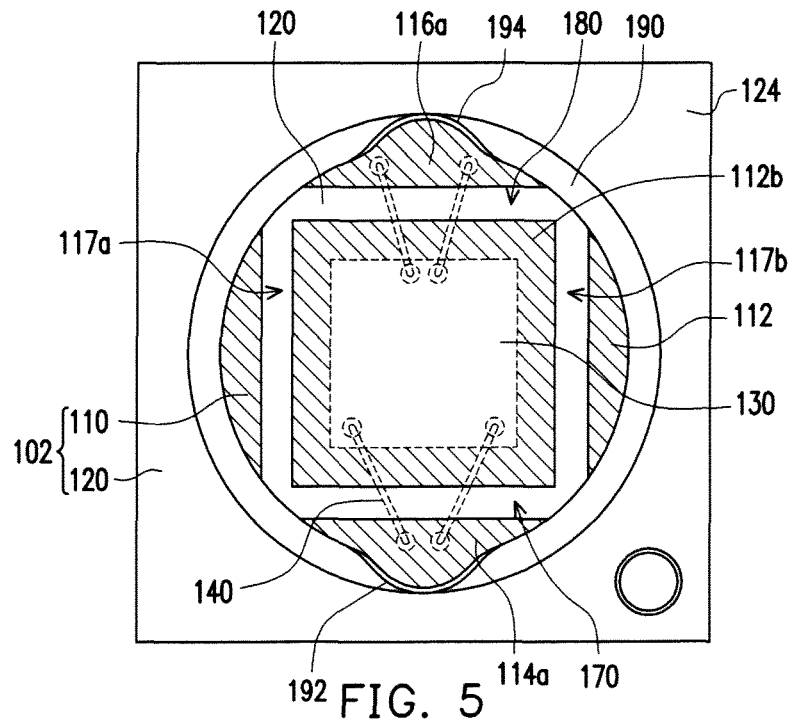
FIG. 5 is a top plan view of the LED package of FIG. 1.

Referring to FIG. 5, at least a portion of the die pad 112, a portion of the first electrode 114, and a portion of the second electrode 116 are exposed from the first insulator 120 at the closed bottom of the housing (the exposed portions are illustrated by hatched lines). Moreover, the first gap 170 and the second gap 180 are filled with the first insulator 120 so that the die pad 112 is electrically insulated from the first electrode 114 and the second electrode 116.

With continued reference to FIG. 5, the LED chip 130 is disposed on the upper surface 112a of the die pad 112 in a manner that provides for good heat conduction between the LED chip 130 and the die pad 112. For example, the LED chip 130 can be secured to the upper surface 112a by metal soldering. Wires 140 connect the exposed portion of the first electrode 114 or the second electrode 116 to electrical contacts (e.g., anode and cathode contacts) of the LED chip. In alternative embodiments where the cathode contact is not disposed on the upper side of the chip 130, as in the illustrated embodiment, but is instead on its lower side, it can be electrically connected with the die pad 112 with an electrically conducting material, and one of the electrodes 114, 116 may be omitted.

With continued reference to FIG. 5, the inner side wall of the perimeter portion 124 includes a first notch 192 and a second notch 194 formed at locations corresponding to a first wire bonding region 114a of the first electrode 114 and a second wire bonding region 116a of the second electrode 116, respectively. In alternative embodiments, the notches 192, 194 may be omitted if the wire bonding operation does not require the extra exposed area provided by the notches 192, 194.

With reference back to FIGS. 1 and 2, the second insulator 150 encapsulates the LED chip 130 and the wires 140. In certain embodiments, the second insulator 150 may be a molding compound, such as, for example, a transparent polymer or a translucent polymer, a soft gel, an elastomer. a resin, an epoxy resin, a silicone, and/or an epoxy-silicone hybrid resin. To improve the uniformity of light emitted by the LED package described above, it may be desirable to scatter the light as it emits from the various emitters. For example, adding scattering particles (not shown) to the second insulator 150 will randomly refract the light.

With reference to FIG. 2, the light converting layer 160 is disposed between the second insulator 150 and the LED chip 130, and covers the LED chip 130 and portions of the wires 140 (not shown in FIG. 2). The light converting layer 160 includes particles of a light converting substance (not shown), for example, fluorescent particles. Light, for example, blue light, emitted from the LED chip 130 may be converted by the light converting substance into light of different colors, for example, green, yellow, or red, and the lights of different colors are mixed to generate white light. The light converting layer 160 is optional. For example, the light converting layer 160 may not be required in a monochromatic LED package. In another embodiment, the light converting layer 160 may also be replaced by adding the light converting substance into the second insulator 150.

With continued reference to FIG. 2, the LED package 100 further includes a protection device 132 that protects the chip 130 from excessive current. The protection device 132 is disposed on the second electrode 116 and is electrically connected to the first electrode 114 through a wire (not shown). The first insulator 120 covers the protection element 132.

The protection device 132 may be, for example, a Zener diode. Zener diodes can adjust working voltage and stabilize circuits.

Figure 7:
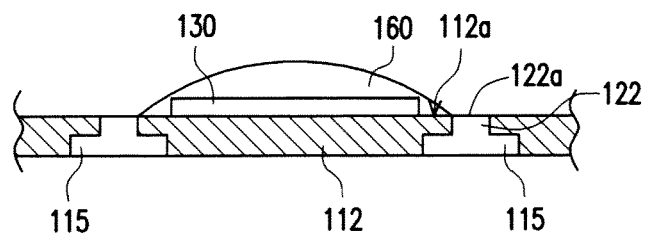
FIG. 7 is a partial side cross-sectional view of the LED package of FIG. 2.

With reference to FIG. 7, which is a partial side cross-sectional view of the LED package of FIG. 2 with the perimeter portion 124 and second insulator 150 omitted for clarity, a portion of the first insulator 120 located in the first gap 170, the second gap 180, the first trench 117a, and the second trench 117b forms a barrier portion 122 surrounding the chip carrying region 112b. The barrier portion 122 has an upper surface 122a substantially coplanar with the upper surface 112a of the die pad 112. In one embodiment, the light converting layer 160 is fowled from a light converting composition including phosphor particles and silica particles dispersed in an optically clear silicone polymer, which can be cured by heat or light. The light converting composition, in a liquid state. may be dispensed onto the chip 130 and the upper surface 112a of the die pad 112 adjacent to the chip 130, and then cured to a solid state, thereby fowling the light converting layer 160. Since the material properties of the light converting composition enable it to better adhere to the metallic die pad 112 than to the organic barrier portion 122. the light converting composition can be confined within the barrier portion 122 and, once cured to a solid state, the resulting light converting layer 160 is confined within the barrier portion 122.

Figure 8:
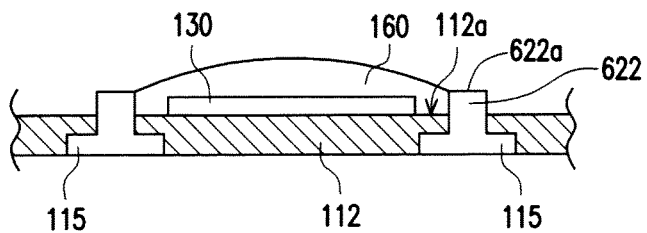
FIG. 8 is a partial side cross-sectional view of another embodiment of an LED package.
Figure 8A:
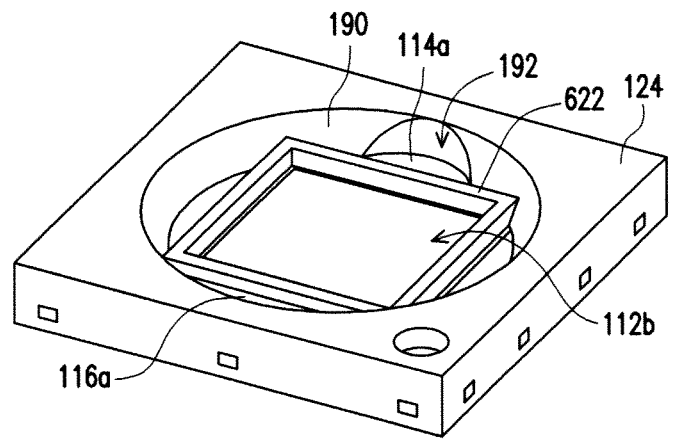
FIG. 8A is a top perspective view of the LED package of FIG. 8.
Figure 9:
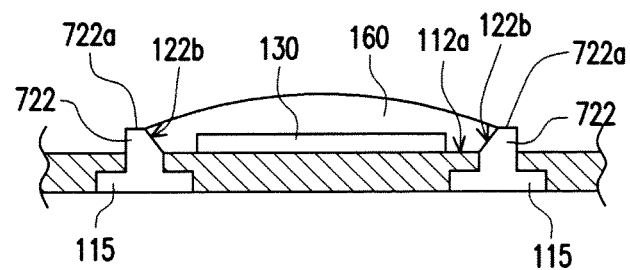
FIG. 9 is a partial side cross-sectional view of another embodiment of an LED package.
Figure 10:
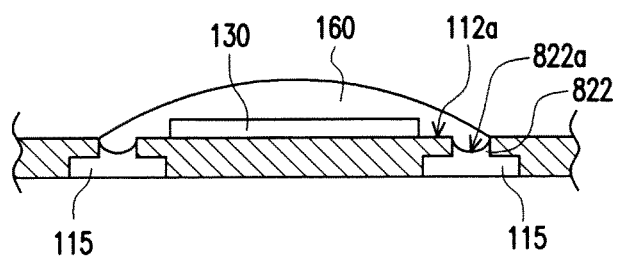
FIG. 10 is a partial side cross-sectional view of another embodiment of an LED package.

Another embodiment is illustrated in FIGS. 8 and 8A, where FIG. 8A is a top perspective view of the LED package of FIG. 8 with the chip 130 and the light converting layer 160 omitted for clarity. The barrier portion 622 has an upper surface 622a that is elevated above the upper surface 112a of the die pad 112. The barrier portion 622 thus confines the light converting layer 160 to the area within the barrier portion 622. In still another embodiment, illustrated in FIG. 9, the barrier portion 722 has an upper surface 722a that is elevated above the upper surface 112a of the die pad 112, and a bevel 122b on a side thereof facing the LED chip 130. This configuration of the barrier portion 722 confines the light converting layer 160 to the area within the barrier portion 722 and increases the light-emitting efficiency. In still another embodiment, illustrated in FIG. 10, the barrier portion 822 has an upper surface 822a that is recessed below the upper surface 112a of the die pad 112, and is concave. This configuration of the barrier portion 822 confines the light converting layer 160 to the area within the barrier portion 822 via the concave profile of the upper surface 822a. The light converting layer 160 confined within the barrier portions 622, 722, 822 of the embodiments of FIGS. 8-10 is preferably cured to be firmly attached to the upper surface 112a of the die pad 112.

Figure 11:
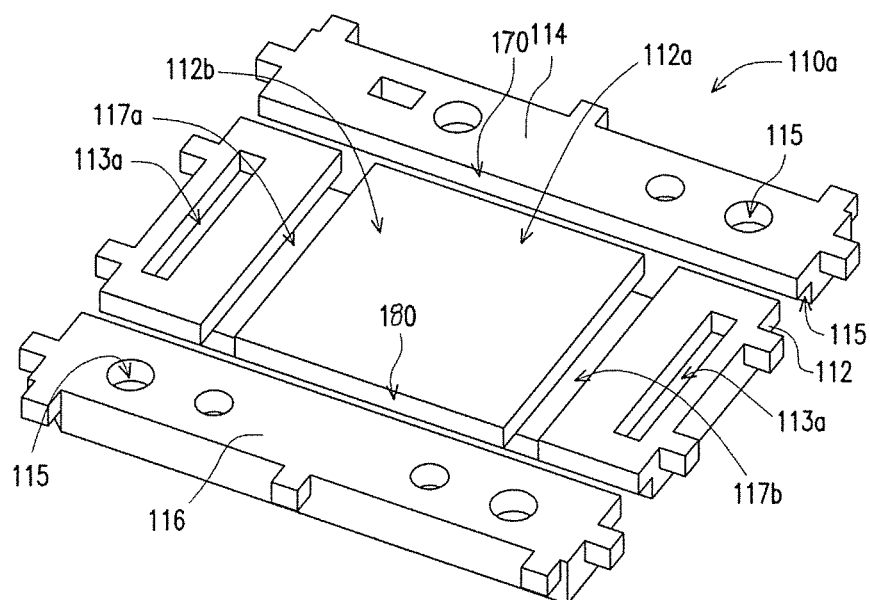
FIG. 11 is a top perspective view of another embodiment of a lead frame for an LED package.

With reference to FIG. 11, a lead frame 110a according to another of the present embodiments includes one or more concave portions 113a on the upper surface 112a of the die pad 112. The concave portions 113a are configured to be filled by the first insulator 120, so as to increase the bonding strength between the die pad 112 and the first insulator 120. thereby reducing the likelihood of de-lamination between the die pad 112 and the first insulator 120. Similarly, the lead frame 110a includes at least one concave portion 115 on a surface of the first electrode 114 and/or the second electrode 116 configured for the same purpose.

Figure 12:
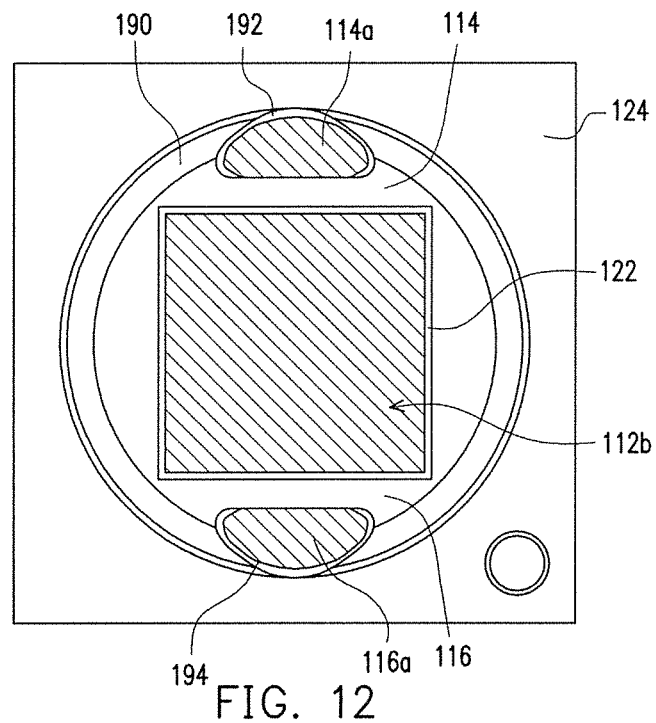
FIG. 12 is a top plan view of another embodiment of an LED package.
Figure 13:
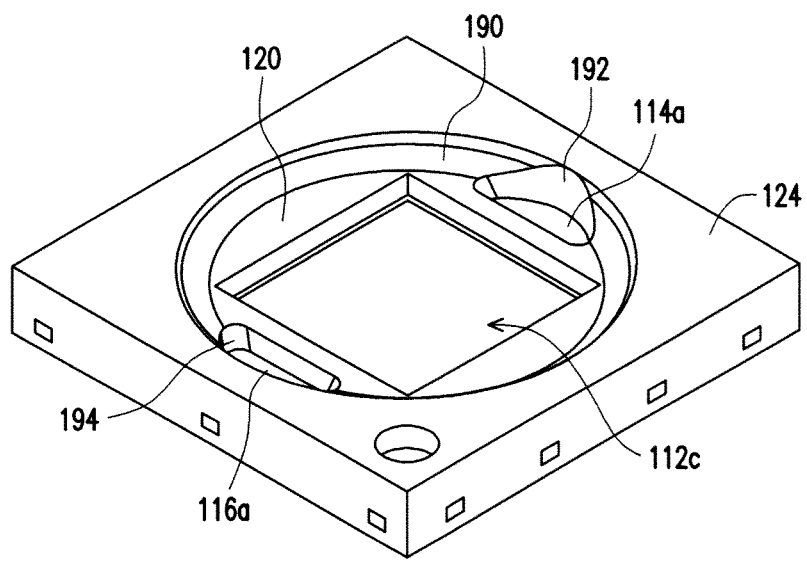
FIG. 13 is a top perspective view of the LED package of FIG. 12.

With reference to FIGS. 12 and 13, in the illustrated embodiment the first insulator 120 covers the entire upper surface of the lead frame 110 except the first wire bonding region 114a, the second wire bonding region 116a, and the chip carrying region 112b. In other words, only the first wire bonding region 114a, the second wire bonding region 116a, and the chip carrying region 112b of the lead frame 110 are exposed from the first insulator 120.

Figure 14:
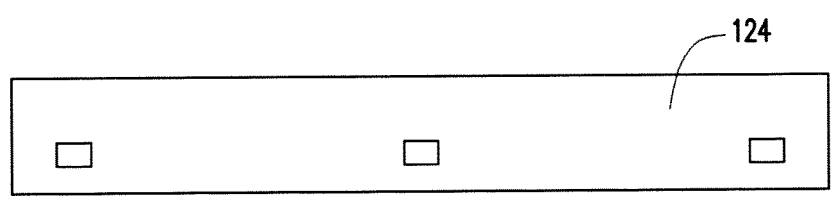
FIGS. 14-16 are side elevation views of three other embodiments of LED packages.
Figure 15:
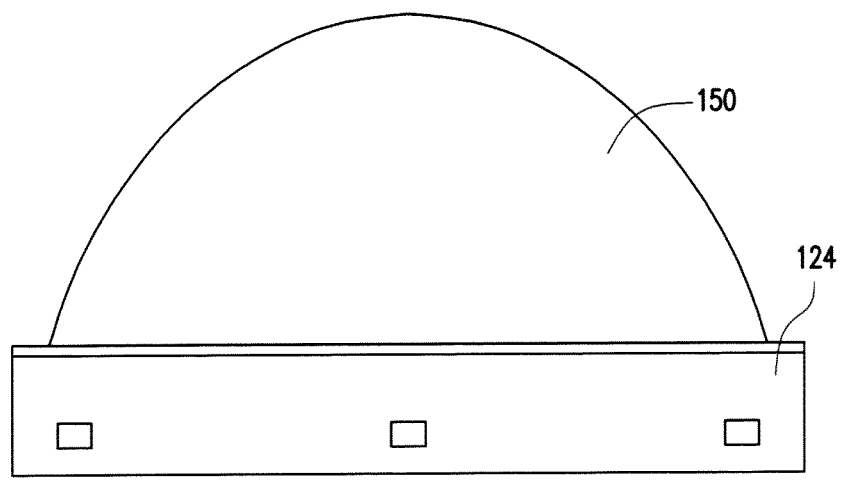
Figure 16:
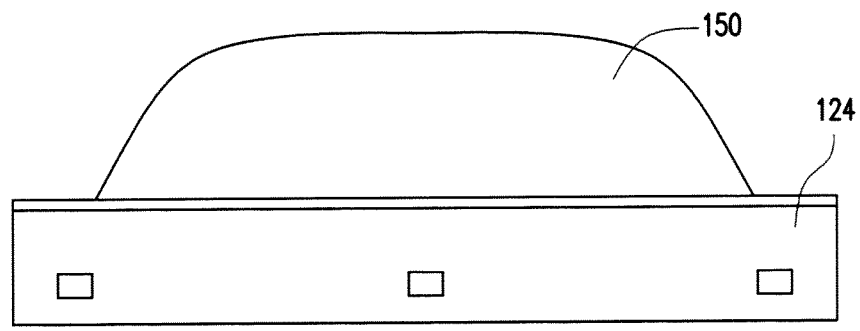

FIGS. 14-16 illustrate side elevation view of several LED packages having different configurations for the second insulator 150. With reference to FIG. 13, a top surface of the second insulator is coplanar with the top surface of the perimeter portion 124. With reference to FIG. 15, the second insulator 150 includes a dome-shaped lens portion that increases the light emitting efficiency of the LED package structure 100. With reference to FIG. 16, the second insulator 150 includes a lens portion shaped like an ellipsoid with the top portion truncated to form a substantially flat surface.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A light-emitting diode (LED) package, comprising:
    a lead frame including a die pad and at least one electrode, the at least one electrode being isolated from the die pad by at least one gap, the die pad including first and second trenches located within the opening of the housing, both ends of each of the first and second trenches opening into the at least one gap;
    a first insulator partially encapsulating the lead frame such that a portion of an upper surface of the die pad and a portion of the at least one electrode are exposed from the first insulator and the at least one gap and the first and second trenches are at least partially filled by the first insulator;
    an LED chip disposed on the exposed portion of the upper surface of the die pad and located between the first and second trenches;
    wherein the die pad has a lower surface such that the lower surface is exposed to an exterior of the package, the exposed lower surface being contiguous;
    wherein the die pad includes at least one upper surface protrusion which is oriented towards the exterior of the package and is partially encapsulated by the first insulator; and
    wherein the at least one electrode has a lower surface and an upper surface such the lower surface is smaller than the upper surface and the at least one electrode has an upper surface protrusion which is oriented towards an interior of the package wherein the upper surface protrusion has a lower surface which is smaller than the at least one electrode lower surface.

2. The LED package of claim 1, further comprising a first insulator lower surface, wherein the first insulator lower surface, exposed die pad lower surface and at least one electrode lower surface are substantially coplanar.

3. The LED package of claim 2. further comprising a first insulator exterior vertical surface contiguous with and orthogonal to the first insulator lower surface, wherein the at least one electrode includes a second upper surface protrusion oriented towards the exterior of the package wherein a portion of the second upper surface protrusion is coplanar with, and exposed on, the first insulator exterior vertical surface.

4. The LED package of claim 3, further comprising a second insulator disposed over the LED chip.

5. The LED package of claim 4, wherein the second insulator includes a vertical perimeter surface which is substantially coplanar with the first insulator exterior vertical surface.

6. The LED package of claim 4, wherein an upper surface of the second insulator is substantially coplanar with an upper surface of the first insulator.

7. The LED package of claim 4, wherein the second insulator includes a lens portion having an ellipsoid shape.

8. The LED package of claim 7, wherein an upper surface of the second insulator defines a substantially flat surface.

9. The LED package of claim 4, further comprising
a light converting layer disposed between the LED chip and the second insulator; and
a gap between the light converting layer and the second insulator.

10. The LED package of claim 4, further comprising a light converting layer disposed between the LED chip and the second insulator, wherein the light converting layer has physical contact with the LED chip and the second insulator.

11. A light-emitting diode (LED) package, comprising:
a housing including a die pad and at least one electrode, the at least one electrode being isolated from the die pad by at least one gap, a first insulator filling the at least one gap and partially encapsulating the die pad and the at least one electrode such that a portion of an upper surface of the die pad and a portion of the at least one electrode are exposed from the first insulator;
wherein the die pad includes first and second trenches such that the ends of each of the first and second trenches open into the at least one gap and are at least partially filled by the first insulator;
an LED chip disposed on the exposed portion of the upper surface of the die pad and located between the first and second trenches;
wherein the die pad has a lower surface such that the lower surface is exposed to an exterior of the package, the exposed lower surface being contiguous;
wherein the die pad includes at least one upper surface protrusion which is oriented towards the exterior of the package and is partially encapsulated by the first insulator; and
wherein the at least one electrode has a lower surface and an upper surface such the lower surface is smaller than the upper surface and the at least one electrode has an upper surface protrusion which is oriented towards an interior of the package wherein the upper surface protrusion has a lower surface which is smaller than the at least one electrode lower surface.

12. The LED package of claim 11, further comprising a first insulator lower surface wherein the first insulator lower surface, exposed die pad lower surface and at least one electrode lower surface are substantially coplanar.

13. The LED package of claim 12, further comprising a first insulator exterior vertical surface contiguous with and orthogonal to the first insulator lower surface, wherein the at least one electrode includes a second upper surface protrusion oriented towards the exterior of the package wherein a portion of the second upper surface protrusion is coplanar with, and exposed on, the first insulator exterior vertical surface.

14. The LED package of claim 13, further comprising a second insulator disposed over the LED chip.

15. The LED package of claim 14, wherein the second insulator includes a vertical perimeter surface which is substantially coplanar with the first insulator exterior vertical surface.

16. The LED package of claim 14, wherein an upper surface of the second insulator is substantially coplanar with an upper surface of the first insulator.

17. The LED package of claim 14, wherein the second insulator includes a lens portion having an ellipsoid shape.

18. The LED package of claim 17, wherein an upper surface of the second insulator defines a substantially flat surface.

19. A light-emitting diode (LED) package, comprising:
a carrier including a die pad and at least one electrode, the at least one electrode being isolated from the die pad by at least one gap, the die pad including first and second trenches located within the opening of the housing, both ends of each of the first and second trenches opening into the at least one gap;
a molding compound partially encapsulating the carrier such that a portion of an upper surface of the die pad and a portion of the at least one electrode are exposed from the molding compound and the at least one gap and the first and second trenches are at least partially filled by the molding compound;
an LED chip disposed on the exposed portion of the upper surface of the die pad and located between the first and second trenches;
wherein the die pad has a lower surface such that the lower surface is exposed to an exterior of the package, the exposed lower surface being contiguous;
wherein the die pad includes at least one upper surface protrusion which is oriented towards the exterior of the package and is partially encapsulated by the molding compound; and
wherein the at least one electrode has a lower surface and an upper surface such the lower surface is smaller than the upper surface and the at least one electrode has an upper surface protrusion which is oriented towards an interior of the package wherein the upper surface protrusion has a lower surface which is smaller than the at least one electrode lower surface.

20. The LED package of claim 19, further comprising:
a molding compound lower surface wherein the molding compound lower surface, exposed die pad lower surface and at least one electrode lower surface are substantially coplanar; and
a molding compound exterior vertical surface contiguous with and orthogonal to the first insulator lower surface, wherein the at least one electrode includes a second upper surface protrusion oriented towards the exterior of the package wherein a portion of the second upper surface protrusion is coplanar with, and exposed on, the first insulator exterior vertical surface.

* * * * *